United States Patent
Hirler et al.

(10) Patent No.: US 8,546,875 B1
(45) Date of Patent: Oct. 1, 2013

(54) VERTICAL TRANSISTOR HAVING EDGE TERMINATION STRUCTURE

(75) Inventors: Franz Hirler, Isen (DE); Andreas Meiser, Sauerlach (DE)

(73) Assignee: Infineon Technologies Austria AG, Villach (AT)

( * ) Notice: Subject to any disclaimer, the term of this patent is extended or adjusted under 35 U.S.C. 154(b) by 17 days.

(21) Appl. No.: 13/420,076

(22) Filed: Mar. 14, 2012

(51) Int. Cl.
*H01L 29/40* (2006.01)

(52) U.S. Cl.
USPC .............. 257/330; 257/E21.088; 257/E21.41; 438/138

(58) Field of Classification Search
USPC .................... 257/329, 330, E21.088, E21.41; 438/138
See application file for complete search history.

(56) References Cited

U.S. PATENT DOCUMENTS

| 6,124,612 A * | 9/2000 | Tihanyi et al. ............... 257/330 |
| 6,284,604 B1 * | 9/2001 | Tihanyi ........................ 438/268 |
| 6,373,097 B1 * | 4/2002 | Werner ......................... 257/329 |

FOREIGN PATENT DOCUMENTS

DE 102004052153 A1 4/2005

OTHER PUBLICATIONS

Hirler et al. "A Method for Forming a Semiconductor Device and a Semiconductor Device." U.S. Appl. No. 13/088,555, filed Apr. 18, 2011.
Hirler et al. "A Semiconductor Device and a Method for Forming a Semiconductor Device." U.S. Appl. No. 13/205,759, filed Aug. 9, 2011.
Hirler et al. "Semiconductor Component with a Semiconductor Via." U.S. Appl. No. 12/964,865, filed Dec. 10, 2010.

* cited by examiner

*Primary Examiner* — John C Ingham
(74) *Attorney, Agent, or Firm* — Murphy, Bilak & Homiller, PLLC

(57) ABSTRACT

Described herein are embodiments of a vertical power transistor having drain and gate terminals located on the same side of a semiconductor body and capable of withstanding high voltages in the off-state, in particular voltages of more than 100V.

20 Claims, 14 Drawing Sheets

VERTICAL TRANSISTOR HAVING EDGE TERMINATION STRUCTURE

TECHNICAL FIELD

Embodiments of the present invention relate to a semiconductor device, in particular a semiconductor device with a source region and a gate electrode that are contacted on opposite sides of a semiconductor body.

BACKGROUND

Vertical power transistors, in particular vertical MOS transistors, such as power MOSFETs (Metal Oxide Semiconductor Field-Effect Transistors) or power IGBTs (Insulated Gate Bipolar Transistors) are widely used in industrial, automotive or consumer applications, such as power converter circuits, or load drive circuits for different types of loads, such as lamps or motors. Vertical power transistors include a semiconductor body and a load path extending in a vertical direction of the semiconductor body, so that load terminals (source and drain terminals) are located on opposite sides of the semiconductor body.

Usually, a gate terminal of a vertical MOS transistor is located on the same side of the semiconductor body as the source terminal. This is because, the source region and the gate electrode are usually located close to the surface region on the same side of the semiconductor body. However, there are applications in which it is desirable to only have the source terminal (source metallization) on one side of the semiconductor body and to have the drain terminal and the gate terminal on the opposite side. Having only the source terminal on one side of the semiconductor body is, e.g., beneficial in those applications in which the MOS transistor is employed as a low side switch that has the source terminal connected to a terminal with a low-side supply potential, such as ground. In this case, the source metallization can be directly soldered to a contact surface, such as a leadframe, connected to the low-side potential. When the low-side potential is ground, the leadframe can be directly mounted to a cooling element without providing an electrical insulation between the leadframe and the cooling element. This provides for an efficient cooling of the MOS transistor, in which most of the heat is dissipated close to the source region and, therefore, close to the surface where the source terminal is located.

There is a need to provide a vertical power transistor that has drain and gate terminals located on the same side of a semiconductor body and that is capable of withstanding high voltages in the off-state, in particular voltages of more than 100V.

SUMMARY

One embodiment of the invention relates to a semiconductor device including a semiconductor body with a first surface, a second surface opposite the first surface, a first region and a second region adjoining the first region in a lateral direction of the semiconductor body. The semiconductor device further includes in the first region at least one device cell with a source region, a body region, a drift region, a drain region, and a gate electrode. A source electrode is connected to the source region and is arranged on the first surface, and a drain electrode is connected to the drain region and is arranged on the second surface. A first via is located adjacent the second region, extends in a vertical direction of the semiconductor body, is electrically insulated from the second region, and is electrically connected to the gate electrode of the at least one device cell. A gate contact electrode is arranged on the second surface and is electrically connected to the via. The semiconductor device further includes an edge termination structure in the second region, the edge termination structure including a first termination region of the same doping type as the drift region and adjoining the drift region in the lateral direction, and a second termination region of a doping type complementary to the doping type of the first semiconductor region. The second termination region is electrically coupled to the source electrode, is arranged distant to the drift region and the drain region in the lateral direction and is arranged closer to the second surface than to the first surface.

Those skilled in the art will recognize additional features and advantages upon reading the following detailed description, and upon viewing the accompanying drawings.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION

In the following Detailed Description, reference is made to the accompanying drawings, which form a part thereof, and in which is shown by way of illustration specific embodiments in which the invention may be practiced. In this regard, directional terminology, such as "top", "bottom", "front", "back", "leading", "trailing" etc., is used with reference to the orientation of the FIGs. being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1:
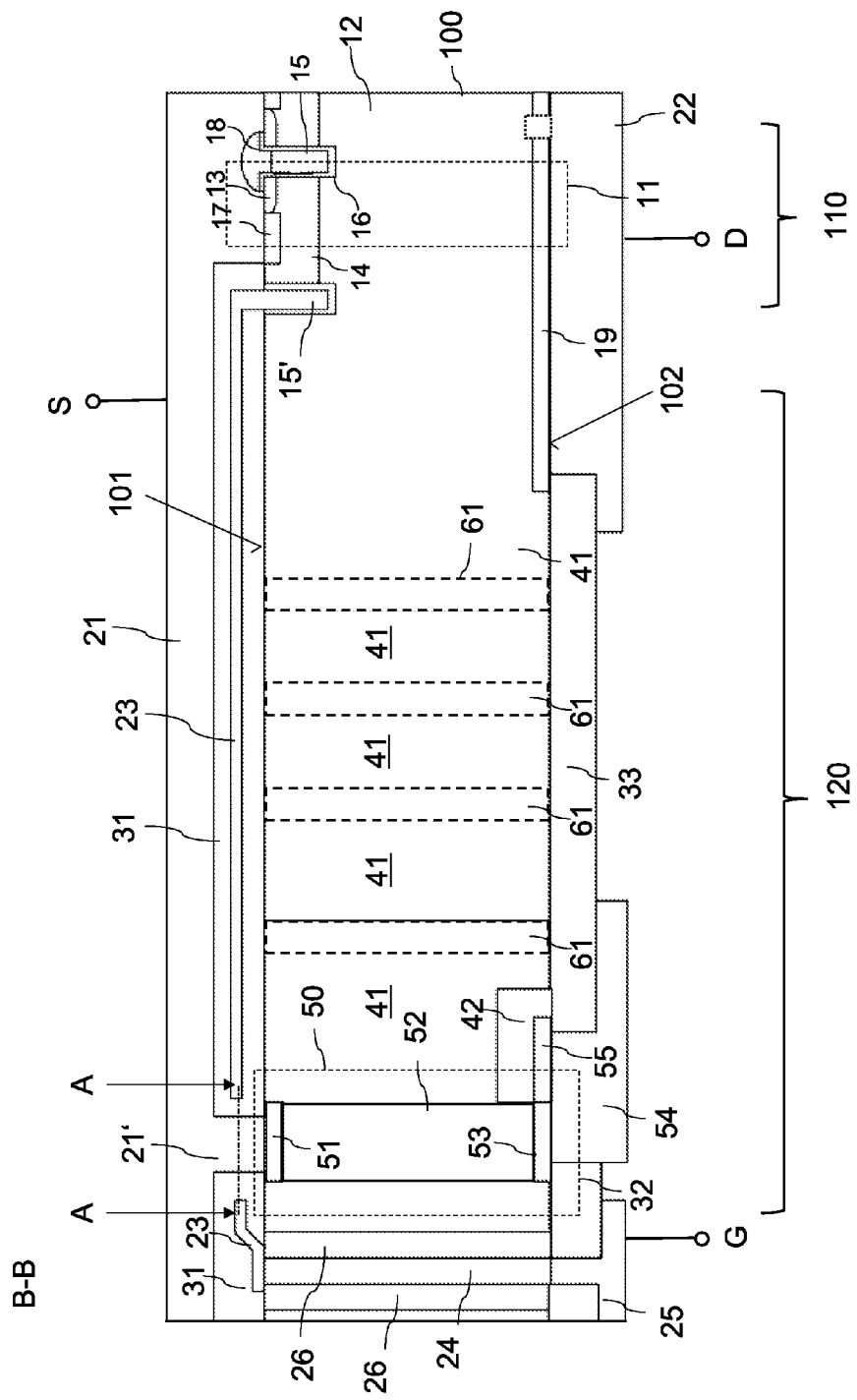
FIG. 1 illustrates a vertical cross sectional view of a semiconductor device including at least one device cell in a first region of a semiconductor body, an edge termination structure in a second region of a semiconductor body, and a gate via connected between a gate electrode and a gate terminal.

FIG. 1 illustrates a vertical cross sectional view of a semiconductor device according to a first embodiment. The semiconductor device includes a semiconductor body 100 having a first surface 101 and a second surface 102 opposite the first surface 101. The semiconductor body 100 includes a first region 110 which will also be referred to as inner region or cell region in the following, and a second region 120 adjoining the first region 110 in a lateral direction of the semiconductor body 100. The second region 120 will also be referred to as edge region in the following. The "vertical direction" of the semiconductor body is a direction perpendicular to the first and second surfaces 101, 102, while the "lateral direction" is a direction parallel to the first and second surfaces 101, 102. In FIG. 1, only a section of the cell region 110 and of the edge region 120 is illustrated. Referring to the explanation below, the edge region 120 may encircle the cell region 110 in the horizontal plane, which is perpendicular to the vertical section plane illustrated in FIG. 1.

The semiconductor body 100 may include a conventional semiconductor material such, e.g., as silicon (Si), silicon carbide (SiC), gallium arsenide (GaAs), or the like.

The semiconductor device is implemented as a transistor, specifically as an MOS transistor and includes at least one transistor cell 11 in the cell region 110. According to one embodiment, the cell region 110 includes a plurality of transistor cells 11 connected in parallel. The at least one transistor cell 11 includes a drift region 12 of a first doping type, a body region 14 of a second doping type complementary to the first doping type, and a source region 13 of the first doping type. The body region 14 is arranged between the source region 13 and the drift region 12. The drift region 12 is located between the body region 14 and a drain region 19. In an embodiment with a plurality of transistor cells (in FIG. 1 two transistor cells 11 are illustrated) the individual transistor cells 11 share the drift region 12 and the drain region 19. Further, the source regions 13 and the body regions 14 of the individual transistor cells 11 are commonly connected to a source electrode 21. Through this, the individual transistor cells 11 are connected in parallel between the source electrode 21 and a drain electrode 22 connected to the drain region 19. Optionally, the body regions 14 of the individual transistor cells 11 are connected to the source electrode 21 via contact regions 17 of the second doping type that are more highly doped than the body region 14 and that provide for a low resistance between the source electrode 21 and the body regions 14.

Each transistor cell 11 further includes a gate electrode 15 arranged adjacent the body region 14 and dielectrically insulated from the body region 14 by a gate dielectric 16. In the embodiment illustrated in FIG. 1, the gate electrode 15 is a trench-electrode that is located in a trench and extends in a vertical direction of the semiconductor body 100 from the source region 13 through the body region 14 into the drift region 12. The gate electrode 15 is electrically insulated from the source electrode 21 by an insulation layer 18. Transistor cells with a trench electrode are usually referred to as trench transistor cells. Implementing the transistor cells 11 as trench transistor cells, however, is only an example. The individual transistor cells 11 could also be implemented as any other types of conventional transistor cells, such as planar transistor cells (not shown) having the gate electrode above the first surface 101 of the semiconductor body 100.

The transistor cells 11 of FIG. 1 can be implemented as cells of an enhancement transistor or as cells of a depletion transistor. In an enhancement transistor there is a conducting channel in the body region 14 when a gate-source voltage other than zero is applied between the gate and source terminal, while in a depletion transistor the conducting channel already exists at a gate-source voltage of 0V. The threshold voltage, which is the gate-source voltage at which the conducting channel sets in, can be adjusted through the doping type and doping concentration of the body region 14 along the gate electrode 15 and through (fixed) charges in the gate dielectric 16.

Figure 18:
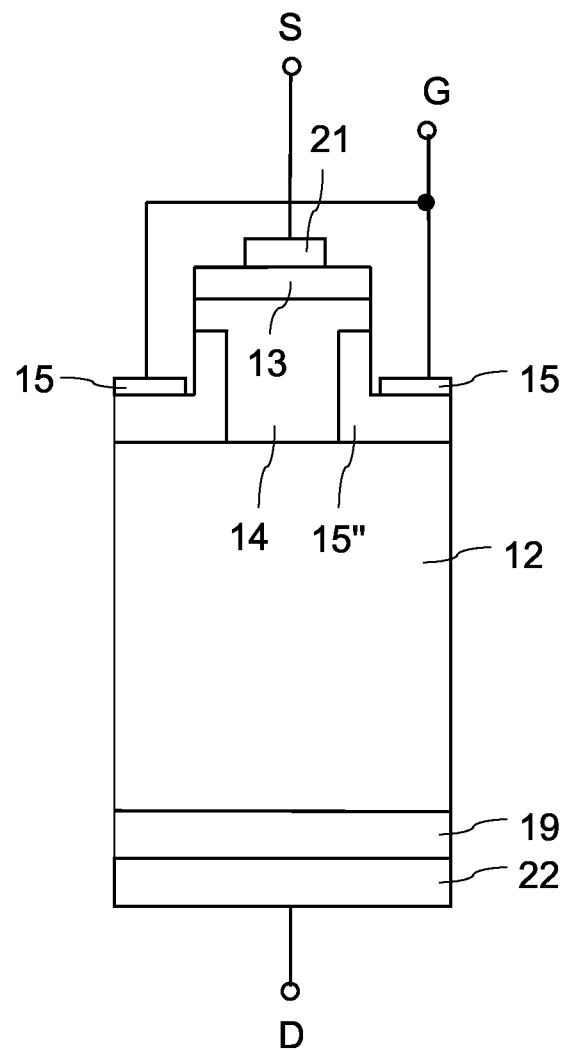
FIG. 18 illustrates a vertical cross sectional view of a transistor cell implemented as a device cell.

Implementing the transistor cells 11 as MOSFET cells as illustrated in FIG. 1 is only an example. The transistor cells 11 could also be implemented as cells of a JFET (Junction FET) as well. An embodiment of a transistor cell implemented as a JFET is illustrated in FIG. 18. Referring to FIG. 18, in the JFET cell, the gate electrode 15 is not dielectrically insulated from semiconductor regions of the JFET, but is electrically connected to a semiconductor gate region 15" that is doped complementarily to the body region 14 and adjoins the body region 14, so that a pn-junction is formed between the base region and the body region 14. In a JFET the doping type of the body region 14 corresponds to the doping type of the source and drift regions 13, 12, wherein the doping concentration of the body region 14 may correspond to the doping concentration of the drift region 12 or may be higher.

The semiconductor device of FIG. 1 is implemented as a vertical semiconductor device which means that a load path between the source electrode 21 and the drain electrode 22 mainly extends in the vertical direction of the semiconductor body 100. The source electrode 21 is arranged on the first surface 101 of the semiconductor body 100, and the source and body regions 13, 14 and the gate electrode 15 are implemented close to the first surface 101, with the source region 13 adjoining the first surface 101 in the embodiment illustrated in FIG. 1. The drain electrode 22 is arranged on the second surface 102, and the drain region 19 adjoins the second surface 102. The distance between the body region 14 and the drain region 19, which can also be referred to as length of the drift region 12, is dependent on a desired voltage blocking capability of the semiconductor device and the type of semiconductor material of the semiconductor body 100. As a rule of thumb the length of the drift region 12 is about 10 μm per 100V of desired voltage blocking capability, when silicon as a semiconductor material is used. For example, the length of the drift region 12 is about 60 µm when a voltage blocking capability of about 600V is desired.

The doping concentration of the drift region 12 is, e.g., between $10^{13}$ cm$^{-3}$ and $10^{17}$ cm$^{-3}$, the doping concentration of the body region 14 is, e.g., between $10^{15}$ cm$^{-3}$ and $10^{18}$ cm$^{-3}$, and the doping concentration of the source and drain regions 13, 19 is, e.g., between $10^{18}$ cm$^{-3}$ and $10^{21}$ cm$^{-3}$.

Figure 14:
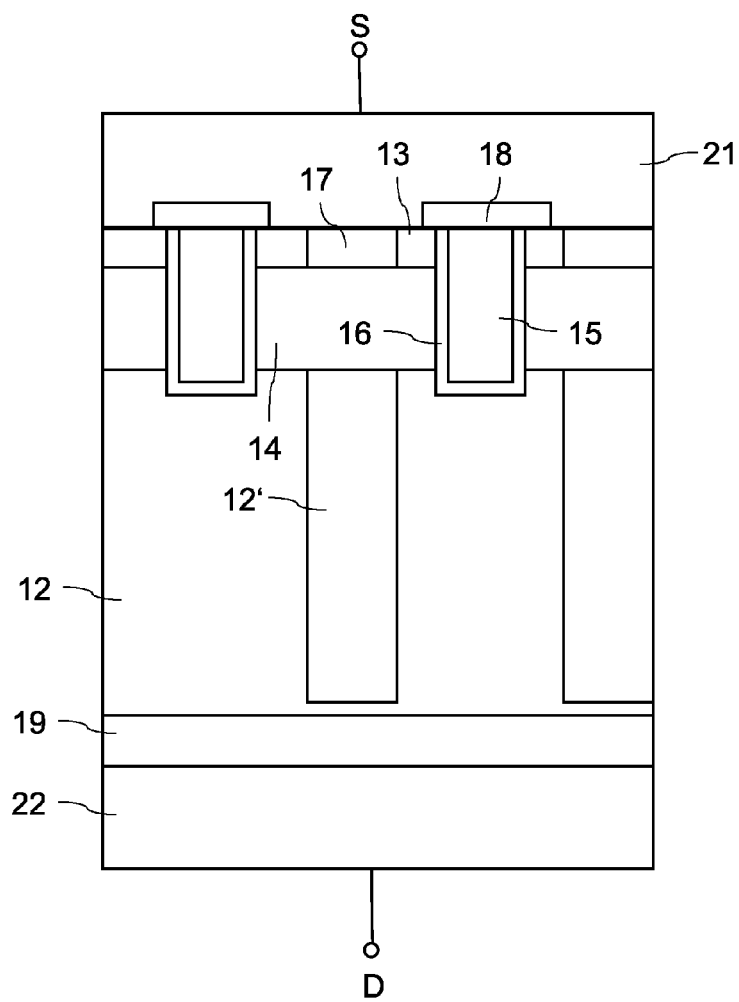
FIG. 14 illustrates a vertical cross sectional view of a semiconductor device having device cells with compensation regions.

The semiconductor device implemented as an MOS transistor can be implemented as an enhancement transistor or as a depletion transistor. In an enhancement transistor the body region 14 adjoins the gate dielectric 16, while in a depletion transistor a channel region (not shown) of the same doping type as the source region 13 and the drift region 12 extends along the gate dielectric 16 and between the gate dielectric 16 and the body region 14. Further, the semiconductor device can be implemented as a MOSFET or as in IGBT. In a MOSFET, the drain region 19 has the same doping type as the drift region 12, while in an IGBT the drain region 19 is doped complementary to the drift region 12. The drain region of an IGBT (that is also referred to as emitter) may include emitter short regions of a doping complementary to the doping type of the drain region and extending from the drain electrode 22 through the drain region 19 to or into the drift region 12. One such emitter short is illustrated in dotted lines in FIG. 1. Further, the semiconductor device can be implemented as an n-type MOS transistor or as a p-type MOS transistor. In an n-type MOS transistor, the source region 13 and the drift region 12 are n-doped, while the body region 14 is p-doped. In a p-type MOS transistor, the source region 13 and the drift region 12 are p-doped, while the body region 14 is n-doped. The MOSFET could also be implanted as a superjunction MOSFET having compensation regions of a doping type complementary to the doping type of the drift region 12 in the drift region 12. An embodiment of a MOSFET implemented as a superjunction MOSFET is illustrated in FIG. 14 and is explained below.

The MOS transistor of FIG. 1 can be switched on and off like a conventional MOS transistor by applying a suitable drive potential to the gate electrode 15. However, unlike a conventional vertical MOS transistor only the source electrode 21 that forms a source terminal S or is connected to a source terminal S is located on the first surface 101, while the drain electrode 22 that forms a drain terminal D or is connected to a drain terminal D and a gate contact electrode 25 forming a gate terminal or being connected to a gate terminal G are located on the second surface 102 opposite the first surface 101. The semiconductor device includes an electrically conducting via 24. The via 24 is electrically connected to the gate terminal electrode 25 on the second surface 102 and extends through the semiconductor body 100 to the first surface 101. The edge region 120 is located between the gate via 24 and the cell region 110

The gate electrodes 15 of the individual transistor cells 11, that are implemented in the region of the first surface 101, are electrically connected to the via 24. The electrical connection between the gate electrodes 15 and the via 24 is provided by an internal gate terminal 15' to which the gate electrodes 15 of the individual transistor cells 11 are connected to, and by a conductor 23 connected between the internal gate electrode 15' and the via 24. The conductor 23 is electrically insulated from the semiconductor body 100 and the source electrode 21 through an insulation layer 31. This conductor 23 will be referred to as gate conductor in the following.

The gate electrodes 15 of the individual transistor cell 11 can be connected to the internal gate terminal 15' in different ways. Two different embodiments are illustrated in FIGS. 2 and 3 which each illustrate a horizontal cross sectional view of a section of the cell region 110 and the internal gate terminal 15'.

Figure 2:
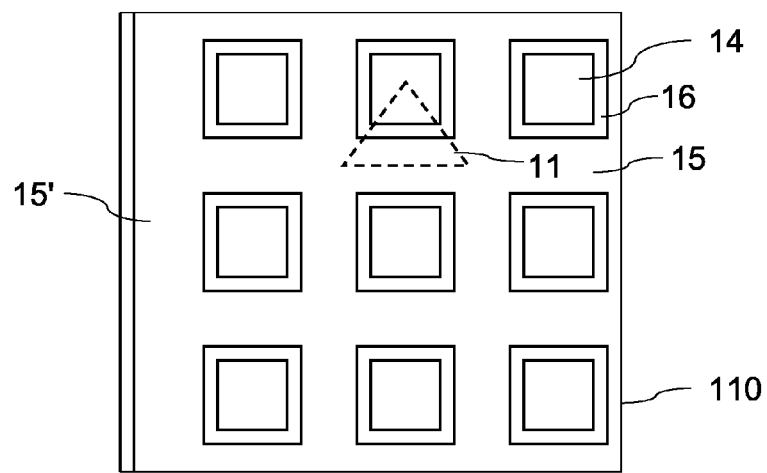
FIG. 2 illustrates a horizontal cross sectional view of the cell region according to a first embodiment.

According to a first embodiment illustrated in FIG. 2, the individual transistor cells 11 have a common gate electrode 15 with a grid shape. In this embodiment, the internal gate terminal 15', which in the embodiment of FIG. 1 is also an electrode located in a trench, is part of the grid. Implementing the gate electrode as a rectangular grid as illustrated in FIG. 2 is only an example. The gate electrode 15 could be implemented with any other grid-shape such as the shape of a hexagonal grid, or of any other polygonal grid as well.

Figure 3:
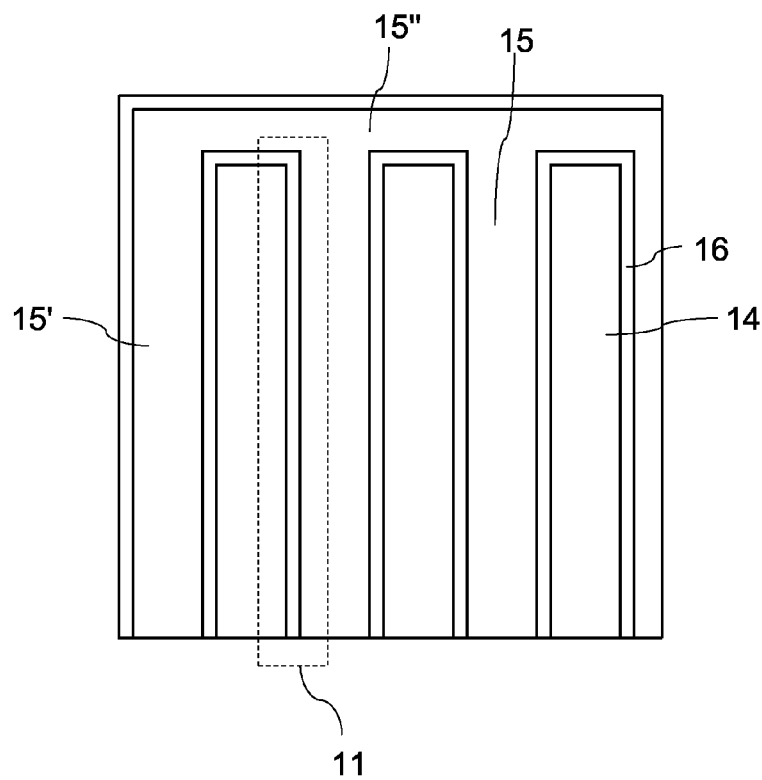
FIG. 3 illustrates a horizontal cross sectional view of the cell region according to a second embodiment.

According to a further embodiment illustrated in FIG. 3, the gate electrodes 15 of the individual transistor cells 11 are elongated electrodes that are electrically connected with each other through a connection electrode 15" arranged in a trench extending perpendicular to the elongated gate electrodes 15 and electrically connected to the internal gate terminal 15'.

The internal gate terminal 15' may include the same material as the gate electrode 15. The gate electrode 15 can be implemented with a conventional gate electrode material, such as a metal or a highly doped polycrystalline semiconductor material, such as polysilicon. The conductor 23 includes, for example, a metal or a highly doped polycrystalline semiconductor material, such as polysilicon.

Referring to FIG. 1, an insulation layer 26 that insulates the gate via 24 from semiconductor regions of the semiconductor body 100 in the second region 120 can be a conventional insulation layer or dielectric layer, such as an oxide layer. The thickness of this insulation layer 26 is selected dependent on the required dielectric strength of the insulation layer 26, where the required dielectric strength is dependent on the maximum voltage difference between the electrical potential of the gate via 24 and the electrical potential of the semiconductor body 100 in those regions adjoining the insulation layer 26. Since a thick insulation layer 26 may cause mechanical stress in the semiconductor body 100, it is desirable to implement the insulation layer 26 as thin as possible. This, however, requires that in each operation mode of the MOS transistor there is only a low voltage difference between the electrical potential of the via 24 and the electrical potential of the semiconductor body 100 in a region adjoining the insulation layer 26.

The maximum voltage difference between the drain terminal D and the source terminal S is dependent on the voltage blocking capability of the MOS transistor. This voltage difference can be up to 100V, up to several 100V, or even up to 1 kV or more. This voltage difference is dependent on a voltage that is applied between the drain and source terminals D, S when the MOS transistor is in operation. This voltage difference reaches its maximum when the transistor is in the off-state (switched off). The maximum voltage difference between the gate terminal G and the source terminal S is, for example, between 10V and 20V. This voltage difference is dependent on the specific type of MOS transistor and is dependent on the electrical potential required at the gate electrode 15 in order to control a conducting channel in the body region 14 between the source region 13 and the drift region 12. For example, in an n-type enhancement transistor the electrical potential of the gate electrode 15 needs to be higher than the electrical potential at the source terminal S in order to switch the transistor on, while electrical potential of the gate electrode 15 may correspond to the electrical potential at the source terminal S in order to switch the transistor off.

In the semiconductor device of FIG. 1, the electrical potential of the semiconductor region adjoining the insulation layer 26 corresponds to the source potential, which is the electric potential of the source terminal S and the source electrode 21. Thus, the maximum voltage across the insulation layer 26 corresponds to the voltage between the gate terminal G and the source terminal S, which is at most several 10V, even when the voltage blocking capability of the semiconductor device is several 100V. Thus, the gate via 24 does not contribute to the gate-drain capacitance of the semiconductor device, which is the capacitance between the gate terminal D and the gate terminal G. In the second region 120, the semiconductor device includes an edge termination structure that keeps the electrical potential close to the insulation layer 26 on or close to source potential and that is configured to withstand a high voltage difference between the electrical potential of the drain region 19 and the region close to the insulation layer 26 when the semiconductor device is in the off-state. The edge termination structure includes a first edge termination region 41 of the first doping type, which is the doping type of the drift region 12. In the embodiment of FIG. 1, the first edge termination region 41 adjoins the drift region 12 in the lateral direction. In the embodiment illustrated in FIG. 1, the first edge termination region 41 reaches from the first surface 101 to the second surface 102. However, this is only an example. According to a further embodiment (not illustrated) at least one semiconductor region of the second doping type is arranged between the first edge termination region 41 and at least one of the first and second surfaces 101, 102. The doping concentration of the first edge termination region 41 may correspond to the doping concentration of the drift region 12. However, according to further embodiments, the doping concentration of the first edge termination region 41 is higher or lower than the doping concentration of the drift region 12.

The edge termination structure further includes a second termination region 42 of a doping type complementary to the doping type of the first termination region 41. The second termination region 42 is arranged distant to the drain region 19 and the drift region 12 in the lateral direction, is arranged closer to the second surface 102 than to the first surface 101, and is electrically coupled to the source electrode 21. In the embodiment illustrated in FIG. 1, the second termination region 42 adjoins the second surface 102.

Referring to FIG. 1, there is a coupling structure 50 that electrically couples or connects the second termination region 42 to the source electrode 21. In this embodiment, the coupling structure 50 includes a coupling region 52 of the second doping type complementary to the first doping type of the first termination region 41. The coupling region is connected to the source electrode 21 on the first surface 101 and is connected to a connection electrode 54 on the second surface 102. Optionally, a first contact region 51 of the second doping type and more highly doped than the coupling region 52 is located between the source electrode 21 and the coupling region 52 in the region of the first surface 101. This first contact region 51 serves to provide an ohmic contact between the source electrode 21 and the coupling region 52. Optionally, a second contact region 53 of the second doping type and more highly doped than the coupling region 52 is arranged between the coupling region 52 and the connection electrode 54. This second contact region 53 serves to provide an ohmic contract between the connection electrode 54 and the coupling region 52. The connection electrode 54 connects the coupling region 52 and/or the optional second contact region 53 to the second termination region 42. Optionally, a third contact region 55 of the second doping type and more highly doped than the second termination region 42 is arranged between the connection electrode 54 and the second termination region 42. This second contact region 55 provides an ohmic contact between the connection electrode 54 and the second termination region 42. According to a further embodiment (not illustrated) the connection electrode 54 is omitted and the second termination region 42 is directly connected to source electrode 21 via coupling region 52.

In the embodiment illustrated in FIG. 1, the coupling region 52 adjoins the second termination region 42 in the lateral direction of the semiconductor body 100. However, this is only an example. According to a further embodiment (not illustrated), these semiconductor regions are distant.

In the semiconductor device of FIG. 1, the source electrode 21 includes a via 21' that extends through the insulation layer 31 to the first surface 101 where it is connected to the coupling region 52 and/or the first contact region 51. The via 21' is electrically insulated from the gate conductor 23. FIG. 1 shows a vertical cross sectional view of the via 21'. In the section plane illustrated in FIG. 1, the via 21' extends through the conductor 23. However, the via 21' of the source electrode 21 does not completely interrupt the conductor 23.

Figure 4:
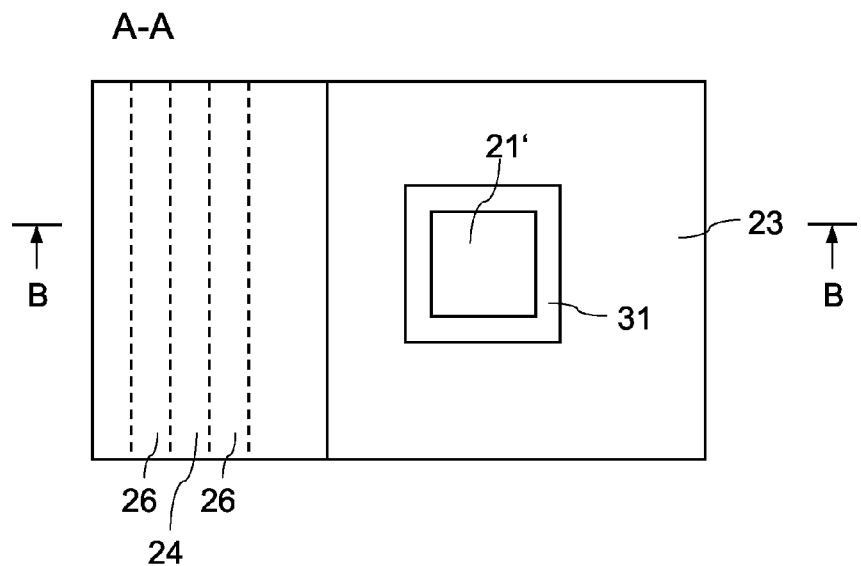
FIG. 4 illustrates one detail of the semiconductor device of FIG. 1.

Referring to FIG. 4, which illustrates a horizontal cross sectional view of the via 21' and of the gate conductor 23 in the region of the via 21', the conductor 23 can be implemented as a planar conductor that encircles the via 21' in the horizontal plane. The position of the via 24 connected to the conductor 23 and of the insulation layer 26 is illustrated in dashed lines in FIG. 4.

The operating principle of the semiconductor device of FIG. 1 is explained below. For explanation purposes it is assumed that the semiconductor device is an n-type enhancement MOS transistor. This type of MOS transistor is in an on-state (switched on) when a positive voltage higher than a threshold value is applied between the gate and source terminals G, S, so that a conducting channel (an inversion channel) is generated in the body region 14 between the source region 13 and the drift region 12. The MOS transistor is in an off-state (switched off) when the voltage between the gate and source terminals G, S is lower than a threshold voltage of the MOS transistor, so that the conducting channel in the body region 14 is interrupted, and when a positive voltage is applied between the drain and source terminals D, S. When a positive voltage is applied between the drain and source terminals D, S and when the MOS transistor is in the off-state, a pn junction between the body region 14 and the drift region 12 is reverse biased so that a depletion region (space charge region) expands in the drift region 12 beginning at the pn junction. In the edge region 120, there is a pn junction between the second termination region 42 and the first termination region 41. From this pn junction a depletion region expands in the lateral direction of the semiconductor body 100 when the MOS transistor is in the off-state, because the electrical potential of the second termination region 42 corresponds to the source potential, while the electrical potential of the drain region 19, that is distant to the second termination region 42 in the lateral direction, is higher than the source potential. The edge termination structure with the second termination region 42, the coupling structure 50 and the first termination region 41 "protects" the semiconductor region adjoining the insulation layer 26 from high electrical potentials occurring at the drain region 19. The voltage blocking capability of the edge termination structure is, inter alia, dependent on the doping concentration of the first termination region 41 and of the distance between the second termination region 42 and the drain region 19, when no additional measures are taken.

According to one embodiment (illustrated in dashed lines in FIG. 1) the edge termination structure includes dielectric layers 61 each extending in the vertical direction of the semiconductor body 100. These dielectric layers 61 may extend from the first surface 101 to the second surface 102 in the vertical direction of the semiconductor body 100. These dielectric layers 61 help to increase the voltage blocking capability of the edge termination structure, so that, at a given voltage blocking capability, the distance between the second termination region 43 and the drain region 19 can be reduced when the dielectric layers 61 are employed. Through this, a space-saving edge termination structure can be implemented.

The edge termination structure adjoins the "edge" of the cell region 110, which is the region in which active device regions of the semiconductor device are implemented. The edge termination structure is not necessarily located near an edge of the semiconductor body 100. Instead, several semiconductor devices with a cell region, such as cell region 110, and an edge region, such as edge region 120, can be implemented in one and the same semiconductor body 100. The individual semiconductor devices are electrically insulated from each other through their edge termination structures and the gate via 24 with the insulation layer 26. According to one embodiment (not illustrated), the individual semiconductor devices can share the same source electrode 21.

Figure 5:
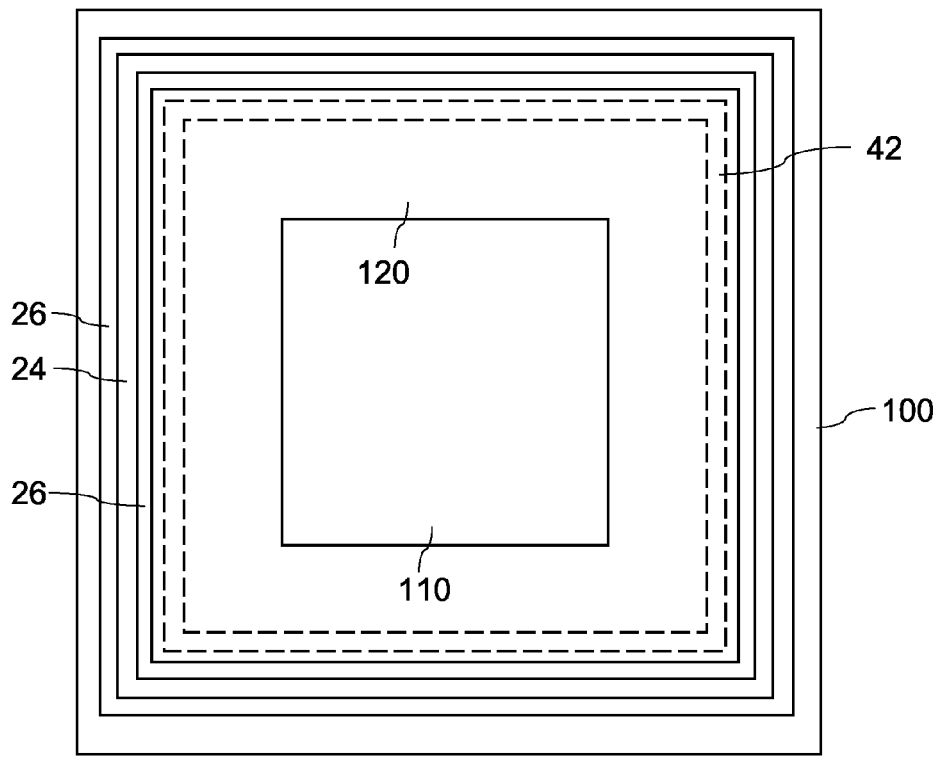
FIG. 5 illustrates a horizontal cross sectional view of a semiconductor device having a via according to a first embodiment.

Referring to FIG. 5, that schematically illustrates a horizontal cross sectional view of the semiconductor body 100, the gate via 24 with the insulation layer 26 may encircle the cell region 110 and the edge region 120 in the horizontal plane. The cell region 110 and the edge region 120 are only schematically illustrated in FIG. 5. Transistor cells in the cell region 110 and the edge termination structure in the edge region 120 are not illustrated. Referring to FIG. 5, the edge region 120 encircles the cell region 110 in the horizontal plane.

FIG. 5 further illustrates an embodiment of the second termination region 42. In this embodiment, the second termination region 42 has the form of a rectangular ring and encircles the cell region 110. However, this is only an embodiment. The second termination region 42 could also be implemented with several separate doped sections of the second doping type that are located in the edge region 120 around the cell region 110.

In FIG. 5, the cell region 110 is drawn to be rectangular, and the gate via 24 and the second termination region 42 are drawn to be rectangular rings. However, this is only for illustration purposes. The cell region 110 could also be implemented to have an elliptical, circular or any type of polygonal shape, while the gate via 24 and the second termination region 42 could be implemented with the shape of corresponding rings.

Figure 6:
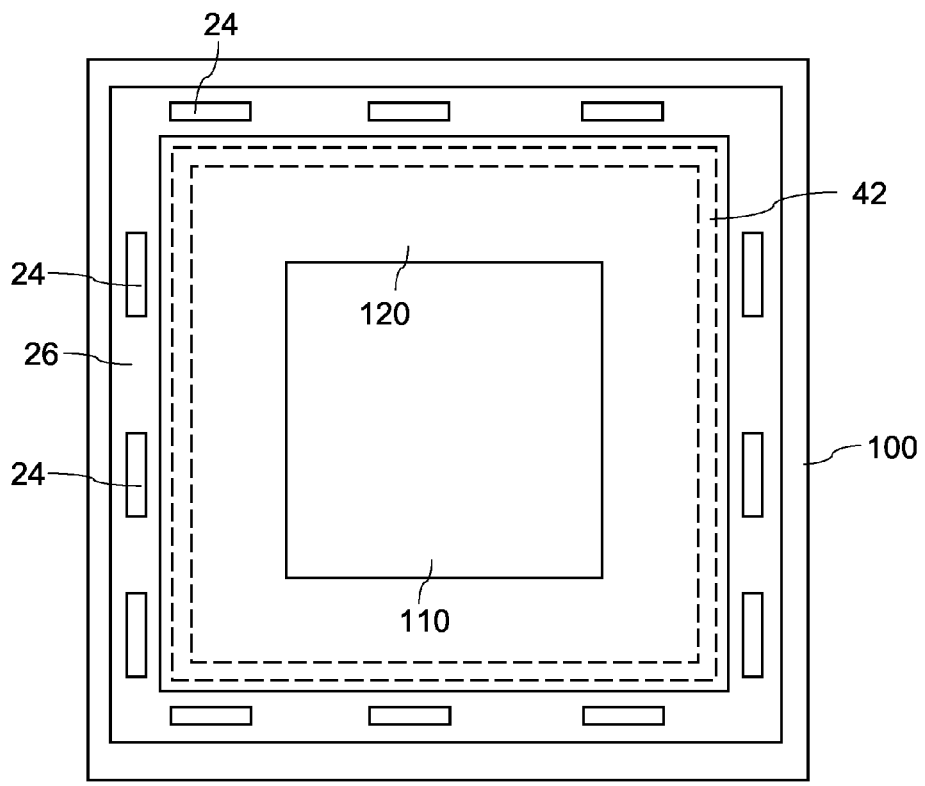
FIG. 6 illustrates a horizontal cross sectional view of a semiconductor device having a gate via according to a second embodiment.

FIG. 6 illustrates a horizontal cross sectional view of a semiconductor device in which the gate via 24 has several via sections located distant to each other around the edge region 120. In this embodiment, the gate via sections are embedded in an insulation region 26 that has the form of a closed ring in the horizontal plane and encircles the cell region 110 and the edge region 120. According to a further embodiment, the semiconductor device includes only one of the gate via sections illustrated in FIG. 6. The at least one gate via section 24 can be arranged at an arbitrary position, such as in a corner, of the insulation layer 26 surrounding the inner region 110 and the edge region 120.

Figure 7:
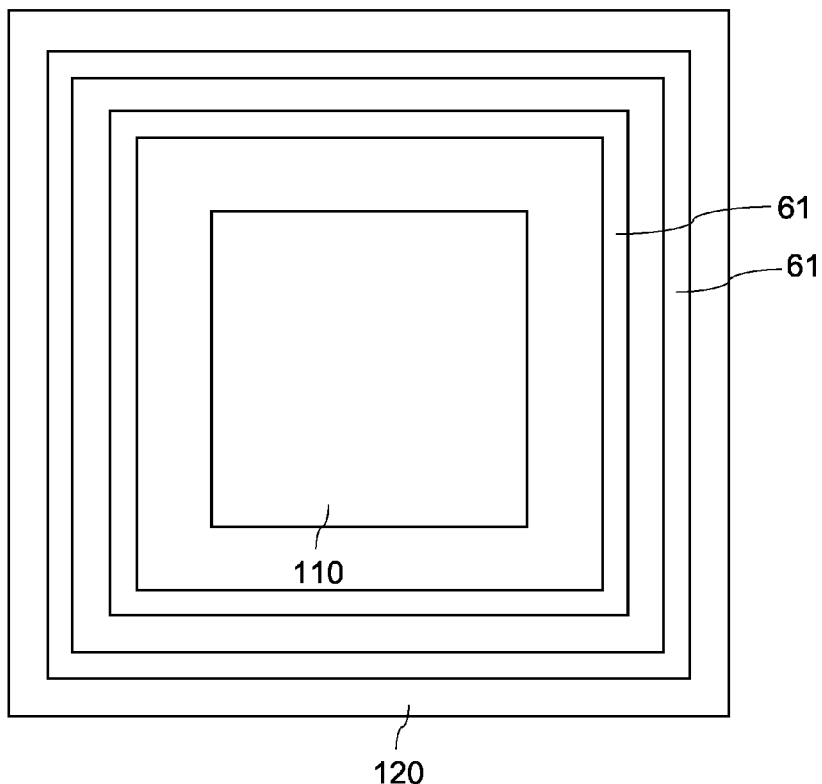
FIG. 7 illustrates a horizontal cross sectional view of a semiconductor device with ring-shaped dielectric layers in the second region.

Referring to FIG. 7, that schematically illustrates a horizontal cross sectional view of only the cell region 110 and the edge region 120, the optional dielectric layers 61 may have the form of closed rings in the horizontal plane, so that these dielectric layers 61 encircle the cell region 110. In FIG. 7, the dielectric layers 61 are drawn to be rectangular rings. However, this is only for illustration purposes. The dielectric layers 61 could also be implemented as an elliptical, circular or any type of polygonal ring.

Figure 8:
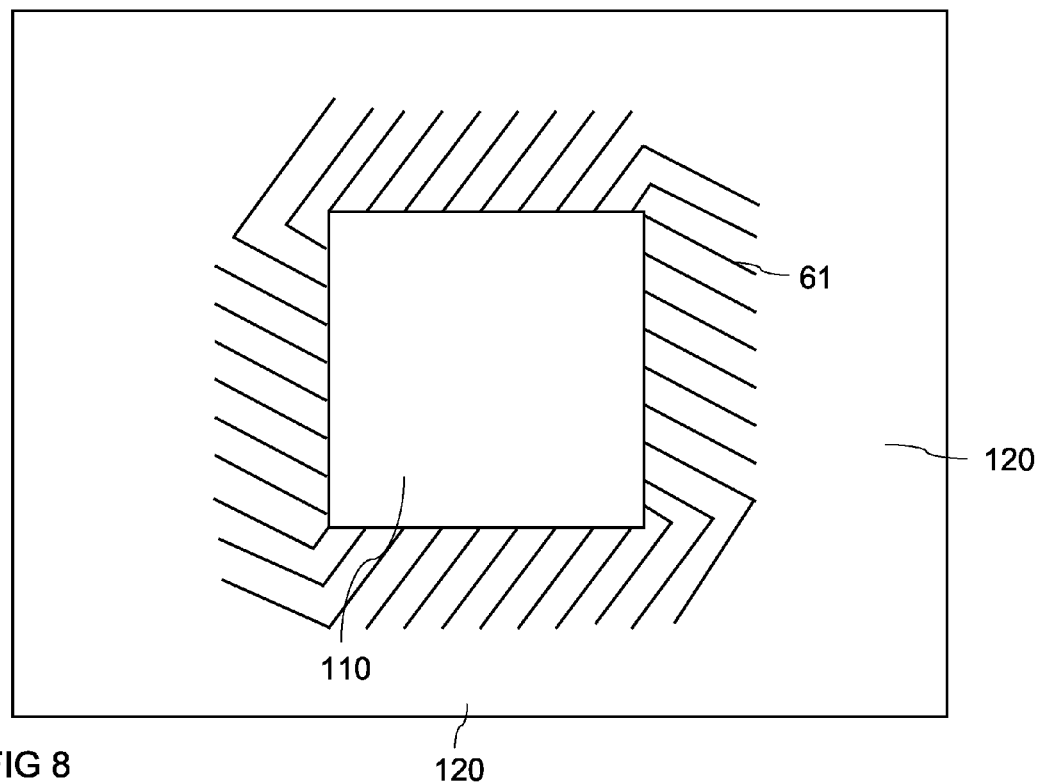
FIG. 8 illustrates a horizontal cross sectional view of a semiconductor device with dielectric layers in the second region according to a further embodiment.

Referring to a further embodiment, illustrated in FIG. 8, the dielectric regions 61 may extend radially outwardly from the cell region 110, where an angle between these dielectric layers 61 and an edge of the cell region 110 is other than 90°, such as, for example, smaller than 30°.

Figure 9:
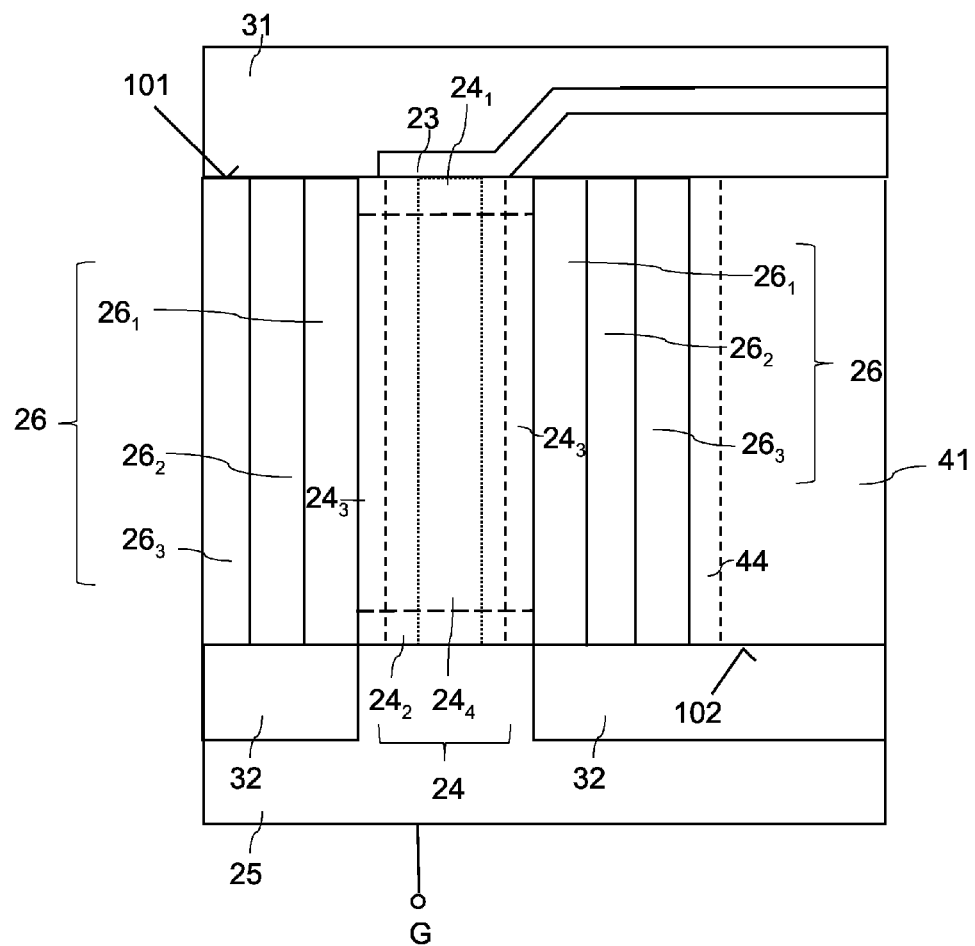
FIG. 9 illustrates a vertical cross sectional view of a gate via according to a further embodiment.

The gate via 24 which is only schematically illustrated in FIG. 1, can be implemented in many different ways. According to one embodiment, the gate via 24 includes a metal or a highly doped polycrystalline semiconductor material, such as polysilicon. According to one embodiment, that is schematically illustrated in FIG. 9, the gate via 24 includes a monocrystalline semiconductor material. Optionally contact regions $24_1$, $24_2$ of the same doping type as the gate via 24 but more highly doped connect the gate via 24 to the gate conductor 23 and the gate terminal electrode 25, respectively. The insulation layer 26 can be a homogenous insulation layer including, for example, an oxide. In the semiconductor body 100, the insulation layer 26 completely insulates the via 24 from surrounding semiconductor regions. The insulation region 26 may completely surround the via 24 in a horizontal direction, or may include two concentrically ring-shaped insulation layers that are distant and between which the via 24 is arranged.

According to a further option, the semiconductor via 24 includes a core $24_4$ (illustrated in dotted lines) including a metal or a highly doped polycrystalline semiconductor material, such as polysilicon. The core $24_4$ helps to reduce the ohmic resistance of the via 24 and may extend from the gate conductor 23 on the first surface 101 to the gate contact electrode 25 on the second surface 102. According to a further embodiment, the core $24_4$ is distant to the first and/or second surface 101, 102.

According to a further embodiment, illustrated in FIG. 9, the insulation layer 26 includes a layer stack with three layers, namely a first layer $26_1$ adjoining the gate via 24, a second layer $26_2$ adjoining the first layer $26_1$ and a third layer $26_3$ adjoining the second layer $26_2$. According to one embodiment, the first and third layers $26_1$, $26_3$ are electrically insulating layers, such as oxide layers, while the second layer $26_2$ can be an electrically conducting or an electrically insulating layer or a void. A process for producing a gate via 24 as illustrated in FIG. 9 may include: etching deep trenches into the (monocrystalline) semiconductor body 100 from the first surface 101, leaving the gate via 24 between the trenches; oxidizing the sidewalls and the bottom of the trenches to form the first and third layers $26_1$, $26_3$; and filling a residual trench with a filling material resulting in the second layer $26_2$. At first, the trenches and, therefore, the gate via 24 do not extend completely through the semiconductor body 100. The semiconductor body 102 is finally thinned or etched back from the second surface 102 so as to uncover the gate via 24 at the second surface 102. After etching of the deep trenches dopants e.g. of a first conductivity type can be introduced into the trench side walls to increase the conductivity of via 24. The dopants can be concurrently introduced into the first edge region 41 to form a lateral field stop. In FIG. 9, reference numeral $24_3$ denotes optional higher doped via regions along the sidewalls of the dielectric layer 26 resulting from the implantation of dopant atoms into the trench sidewalls before forming the dielectric layer 26, and reference numeral 44 denotes a field-stop region along the dielectric layer in the first edge region 41 resulting from the implantation of dopant atoms into the trench sidewalls.

Figure 10:
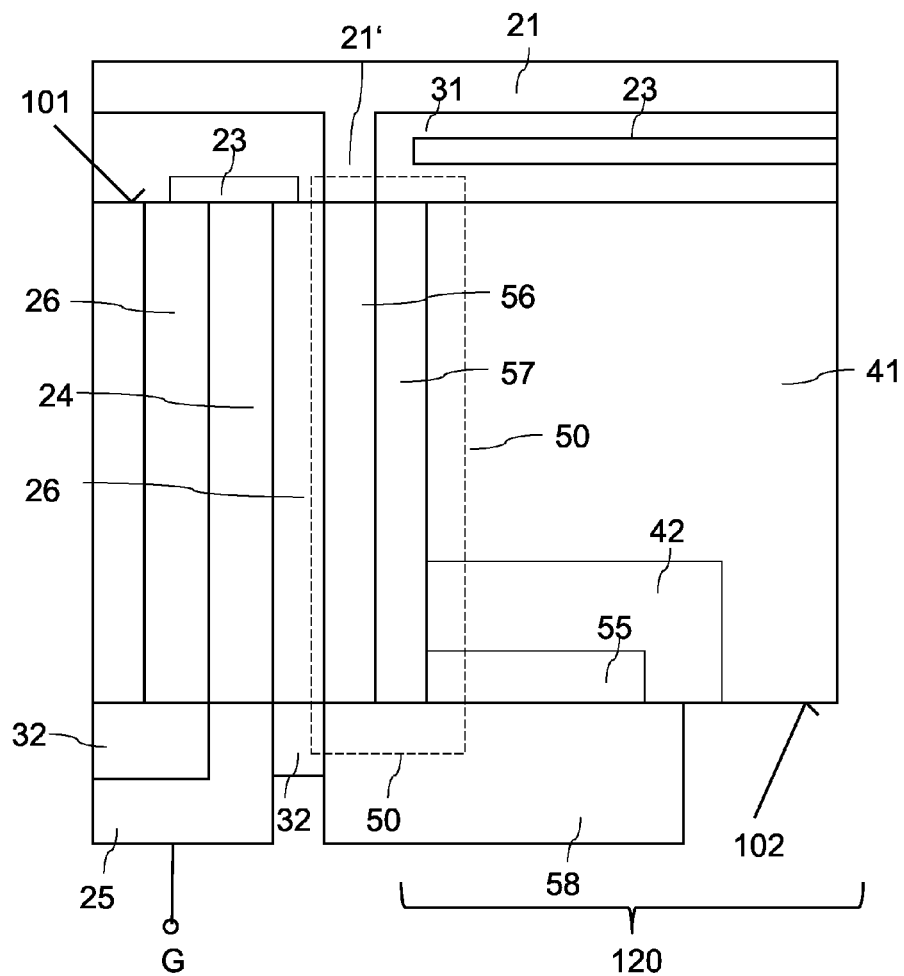
FIG. 10 illustrates a vertical cross sectional view of a semiconductor device having a gate via and a deep source via.

FIG. 10 illustrates a vertical cross sectional view of an edge termination structure according to a further embodiment. In FIG. 10, only a section of the edge termination structure is illustrated, namely the section that includes the second edge region 42 and the gate via 24. In this embodiment, the coupling structure 50 includes a further via 56 that will be referred to as deep source via in the following. The deep source via 56 extends from the first surface 101 to the second surface 102 and is electrically connected to the source via 21' on the first surface 101 and to the connection electrode 58 on the second surface 102. The deep source via 56 is electrically insulated from the gate via 24 and is electrically insulated from the first edge region 41. In the embodiment of FIG. 10, an insulation layer 26 adjoining the gate via 24 also adjoins the deep source via 56 and insulates the gate via 24 from the deep source via 56. A further insulation layer 57 insulates the deep source via 56 from the first termination region 41. The deep source via 56 connects the source electrode 21 via the connection electrode 58 and the optional third contact region 55 to the second termination region 42. In the embodiment of FIG. 10, the deep source via 56 is arranged between the gate via 24 and the edge region 120 of the semiconductor body 100.

Figure 11:
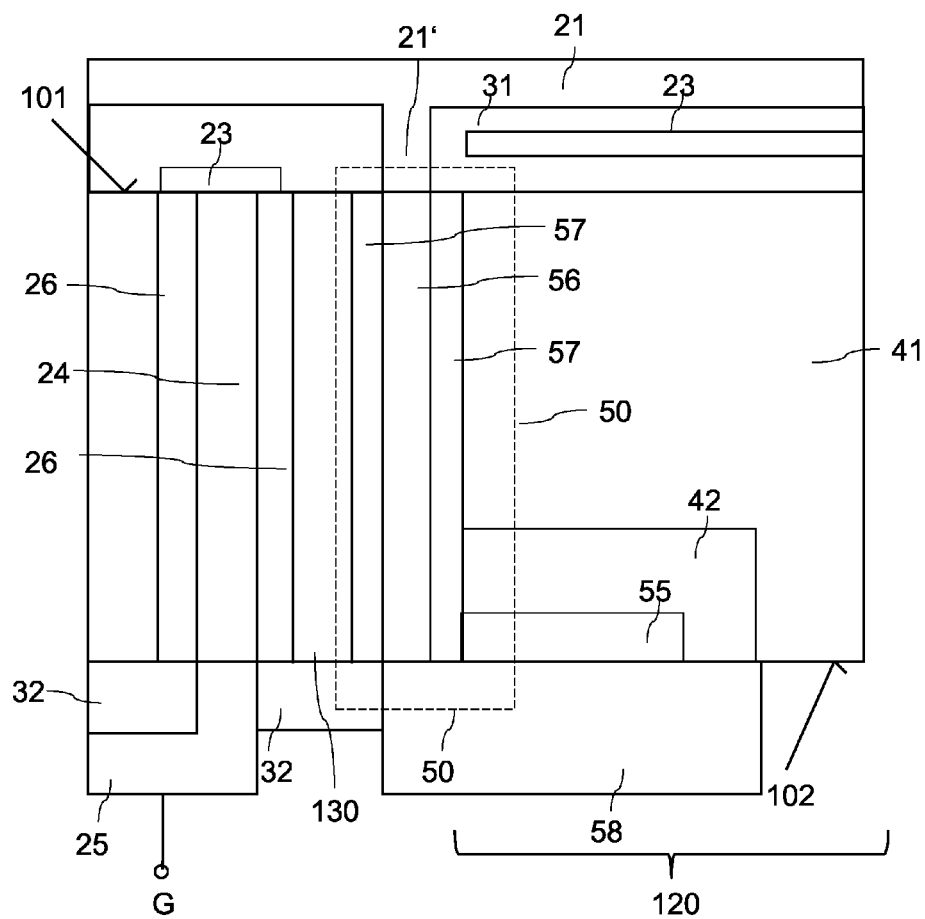
FIG. 11 illustrates a modification of the structure illustrated in FIG. 10.

FIG. 11 illustrates a further embodiment that is different from the embodiment of FIG. 10 in that a section 130 of the semiconductor body 100 is arranged between the insulation layer 26 adjoining the gate via 24 and a further insulation layer 57 adjoining the deep source via 56. The insulation layer 57 completely insulates the deep source via 56 from surrounding semiconductor regions in the semiconductor body 100.

Like the gate via 24, the deep source via 56 may completely surround the inner region 110 and the edge region 120, or may include one or more deep source via sections arranged in the insulation layer 57 that surrounds the inner region 110 and the edge region 120.

Figure 12:
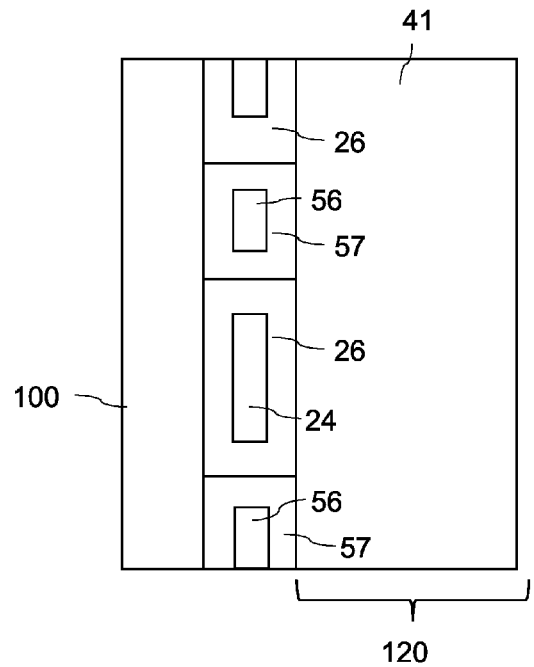
FIG. 12 illustrates a horizontal cross sectional view of a semiconductor device having a gate via and a deep source via according to a further embodiment.

According to a further embodiment, illustrated in FIG. 12, the gate via 24 and the deep source via 56 are arranged alternately along the edge region 12. FIG. 12 only shows a section of a structure that includes the gate vias 24 and the deep source vias 56. Like the gate via 24 illustrated in FIG. 5, the structure with the gate vias 24 and the deep source vias 56 may encircle the edge region 120. Each of the gate vias 24 is connected to the gate electrode 15 and each of the deep source vias 56 is connected to the source electrode 21.

Figure 13:
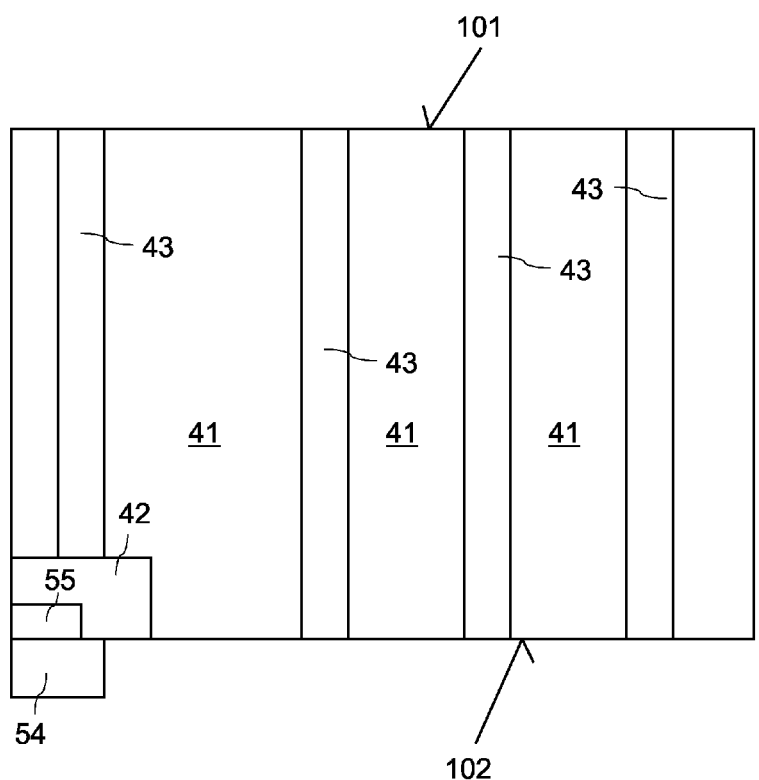
FIG. 13 illustrates a vertical cross sectional view of a semiconductor device having compensation regions in the second region.

FIG. 13 illustrates a vertical cross sectional view of an edge termination structure according to a further embodiment. In FIG. 13, the second termination region 42 and the first termination region 41 are illustrated. The coupling structure 50 is not illustrated in FIG. 13. Any of the coupling structures 50 explained before, can be employed in this edge termination structure. In the embodiment of FIG. 13, the edge termination structure includes doped semiconductor regions of the same doping type as the second termination region 42. These semiconductor regions will be referred to as compensation regions in the following. The compensation regions 43 may extend from the first surface 101 to the second surface 102. One of these compensation regions 43 may extend from the first surface 101 to the second termination region 42. The doping concentration of the compensation regions 43 may correspond to the doping concentration of the first termination region 41, or may be higher or lower. The doping concentration of the compensation regions 43 may vary in the vertical direction.

FIG. 14 illustrates a further embodiment of transistor cells that can be implemented in the cell region 110. These transistor cells are implemented as trench transistor cells and each include a compensation region 12' in the drift region 12. The compensation region 12' has the same doping type as the body region 14. The doping concentration of the compensation region 12' may correspond to the doping concentration of the drift region 12 or may be higher or lower than the doping concentration of the drift region 12.

Figure 15:
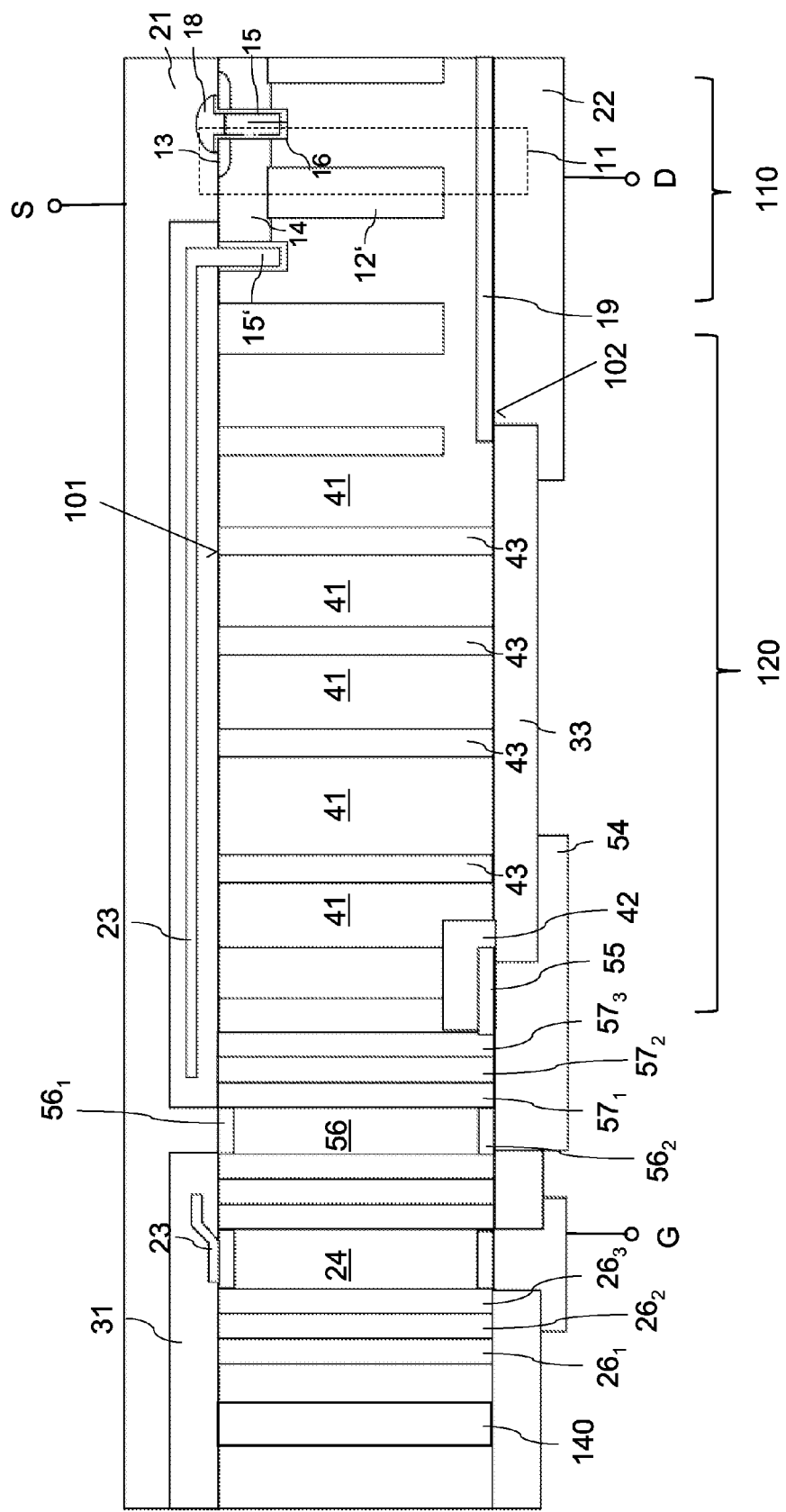
FIG. 15 illustrates a vertical cross sectional view of a semiconductor device including device cells with compensation regions, a second region with compensation regions and a deep source via.

Each of the device cells explained before can be combined with each of the termination structures and each of the gate via structures explained before. Just for illustration purposes, FIG. 15 illustrates a vertical cross sectional view of a semiconductor device that includes transistor cells with compensation regions as illustrated in FIG. 14, an edge termination structure with compensation regions 43 as illustrated in FIG. 13, and a coupling structure 50 with a deep source via 56 as illustrated in FIG. 10. Further, the gate via 24 and the deep source via 56 are implemented as monocrystalline semiconductor regions as explained with reference to FIG. 9. In FIG. 15, reference numbers $56_1$ and $56_2$ denote contact regions of the same doping type as the deep source via 56 but more highly doped, and $57_1$, $57_2$, $57_3$ denote layers of an insulation structure that is similar to the structure with the layers $26_1$, $26_2$, $26_3$ explained before and that insulates the deep source via 56 from the first termination region 41. These contact regions $56_1$, $56_2$ serve to connect the deep source via 56 to the source electrode 21 and the connection electrode 54, respectively.

Referring to FIG. 15, an additional trench 140 reaching from the first surface 101 to the second surface 102 can be arranged distant to the trench with the gate via 24 on the side facing away from the edge region 120. This additional trench 140 can be filled with a dielectric and may act as a chipping stopper when a wafer that includes a plurality of identical semiconductor bodies (dies) is divided into the individual semiconductor bodies.

The MOS transistor explained before may be mounted or soldered to a contact surface with the first surface 101 and the source electrode facing the contact surface. In such a configuration, the first surface 101 is the lower surface and the second surface 102 is the upper surface of the semiconductor body 100. The second termination region 42 is then located near the upper surface. The MOS transistor can therefore be referred to as "Source Down Termination Up" transistor.

Figure 16:
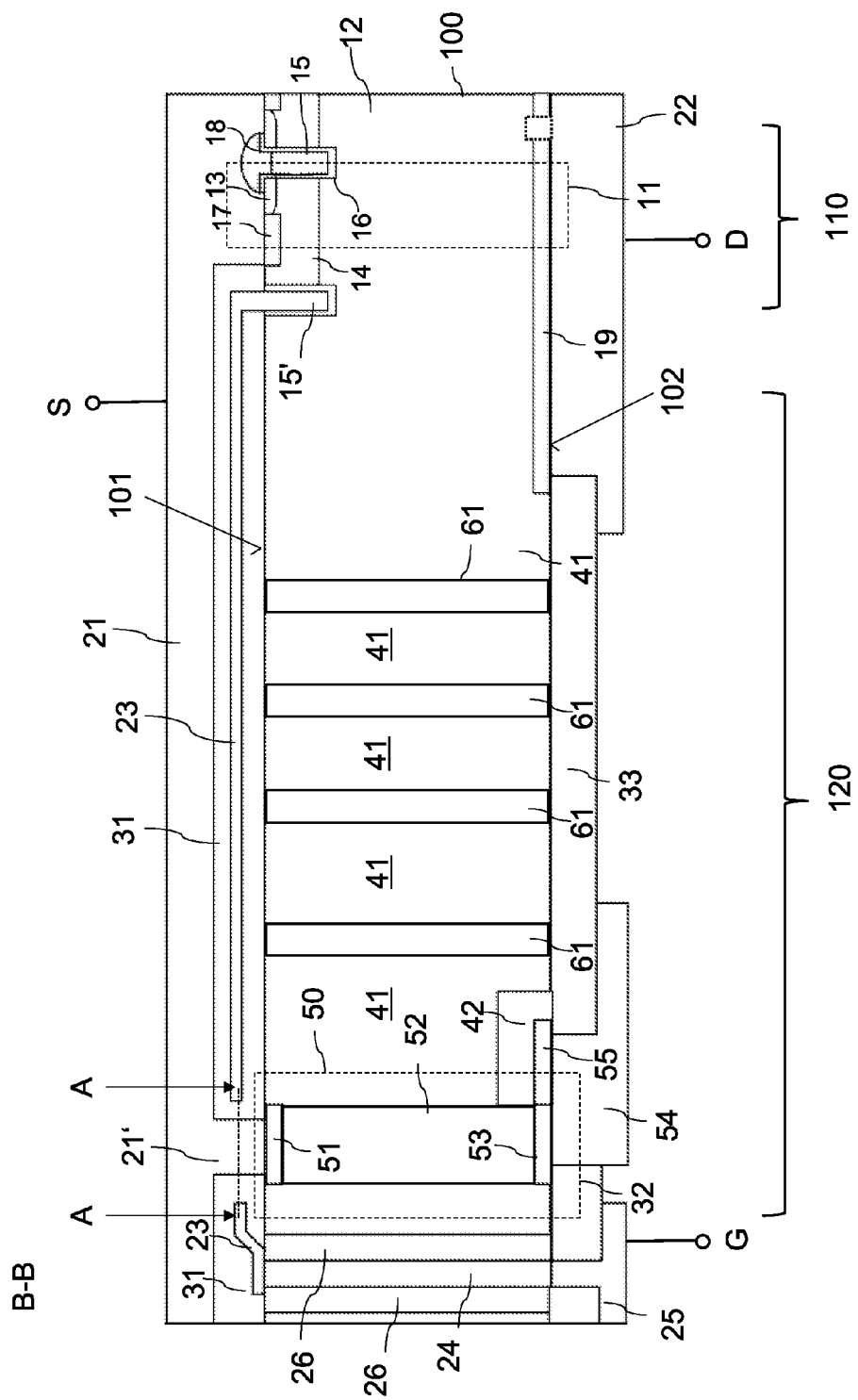
FIG. 16 illustrates a vertical cross sectional view of a semiconductor device according to a further embodiment.

FIG. 16 illustrates a vertical cross sectional view of a semiconductor device according to a further embodiment. The semiconductor device of FIG. 16 is based on the semiconductor device of FIG. 1 and includes at least one dielectric region 61 in the edge region 120. The at least one dielectric region 61 extends from the first surface 101 to the second surface 102 and encircles the inner region 110 in the horizontal plane. In the embodiment of FIG. 16, the coupling structure 50 includes a coupling region 52 of the first doping type and, optionally a first and a second connection region 51, 53 of the first doping type and more highly doped than the coupling region 52. The doping concentration of the coupling region 52 may correspond to the doping concentration of the first termination region 41, or can be higher or lower than the doping concentration of the first termination region 42.

Besides the first and second termination regions 41, 42 the edge termination structure may include additional termination regions, such as the dielectric region 61 of FIGS. 1 and 16 or the compensation regions 42 of FIG. 14. However, providing dielectric regions 61 or compensation regions 43 is only an example. Other conventional termination structures, such as field rings of the second doping type, field plates, VLD (Variation of Lateral Doping) regions of the second doping type, JTEs (Junction Termination Extension) between the second termination region 42 and the drain region 19 along the second surface 102 may be employed as well. Of course, combinations of these termination structures may be employed as well.

Figure 17:
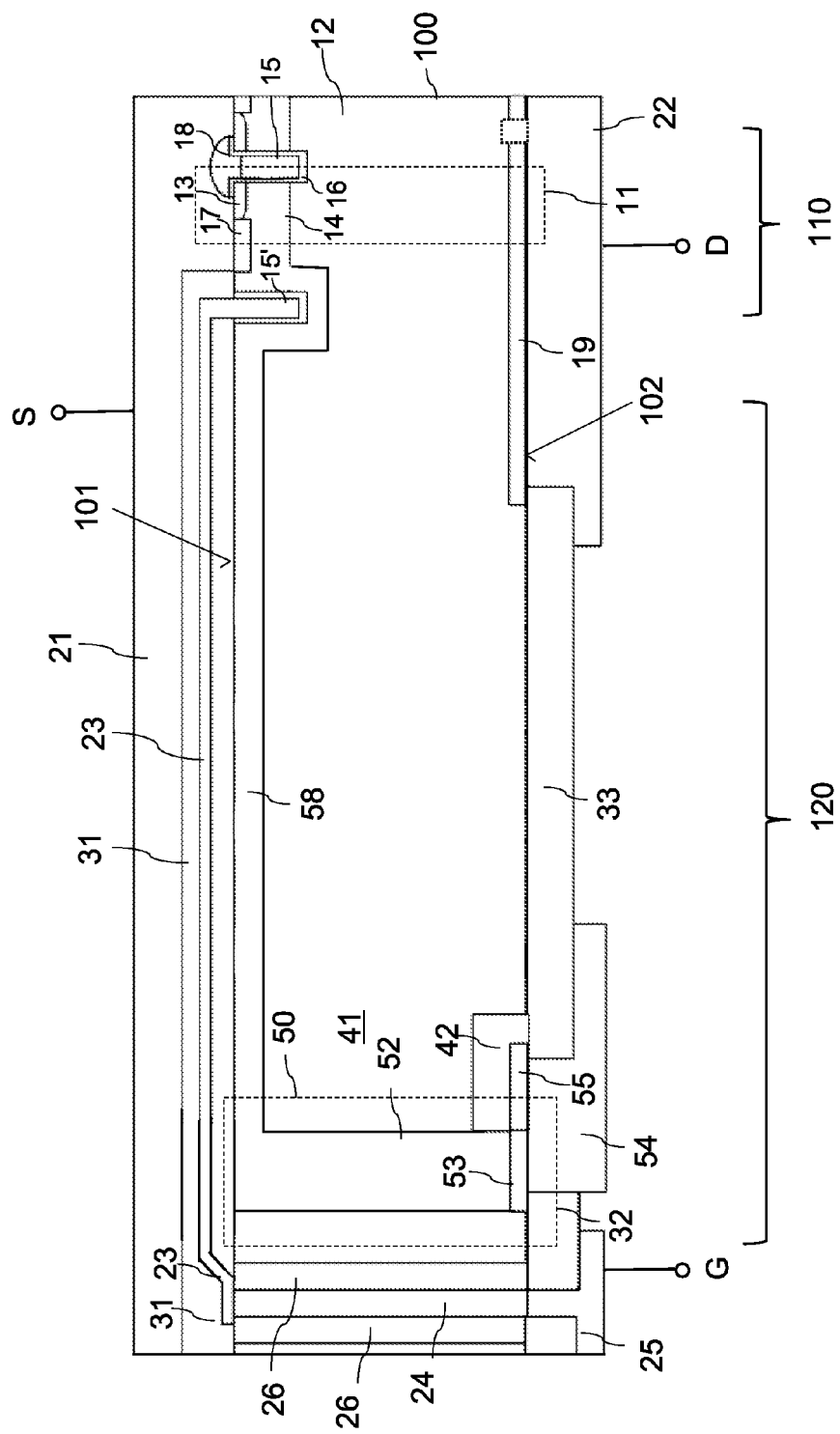
FIG. 17 illustrates a vertical cross sectional view of a semiconductor device according to yet another embodiment.

FIG. 17 illustrates a vertical cross sectional view of a semiconductor device according to another embodiment. In this embodiment, the source electrode via 21' is omitted and the coupling region 52 is connected to a body region extension 58. The body region extension 58 extends along the first surface 101 from the body region 14 to the coupling region 52. The doping type of the body extension 58 corresponds to the doping type of the body region 14 and the doping type of the coupling region 52. The doping concentration of the body extension 58 may correspond to the doping concentration of the body region 14, but could also be higher or lower than the doping concentration of the body region 14.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
a semiconductor body comprising a first surface, a second surface opposite the first surface, a first region and a second region adjoining the first region in a lateral direction of the semiconductor body;
in the first region at least one device cell comprising a source region, a body region, a drift region, a drain region, and a gate electrode;
a source electrode connected to the source region and arranged on the first surface, a drain electrode connected to the drain region and arranged on the second surface;
a first via, extending in a vertical direction of the semiconductor body, electrically insulated from the second region, and electrically connected to the gate electrode of the at least one device cell;
a gate terminal electrode arranged on the second surface and electrically connected to the first via;
an edge termination structure in the second region, the edge termination structure comprising a first termination region of the same doping type as the drift region and adjoining the drift region in the lateral direction, and a second termination region of a doping type complementary to the doping type of the first termination region,
wherein the second termination region is electrically coupled to the source electrode, arranged distant to the drift region and the drain region in the lateral direction and arranged closer to the second surface than to the first surface.

2. The semiconductor device of claim 1, wherein the second termination region adjoins the second surface.

3. The semiconductor device of claim 1, wherein the second termination region is electrically coupled to the source electrode through a coupling structure, comprising:
a contact electrode on the second surface electrically coupled to the second termination region; and
a coupling region of the same doping type as the second termination region electrically coupled to the contact electrode in the region of the second surface and coupled to the source electrode in the region of the first surface.

4. The semiconductor device of claim 3, wherein a first contact region of the same doping type as the coupling region and more highly doped than the coupling region is arranged between the first termination region and the contact electrode, and wherein a second contact region of the same doping type as the coupling region and more highly doped than the coupling region is arranged between the first termination region and the source electrode.

5. The semiconductor device of claim 1, wherein the second termination region is electrically coupled to the source electrode through a coupling structure comprising:
a contact electrode on the second surface and electrically coupled to the second termination region; and
a second via extending in a vertical direction of the semiconductor body, insulated from the second region, electrically connected to the source electrode in the region of the first surface, and electrically connected to the contact electrode in the region of the second surface.

6. The semiconductor device of claim 1, wherein the edge termination structure further comprises a plurality of dielectric regions extending in the vertical direction of the semiconductor body and located between the drift region and the second termination region in the lateral direction of the semiconductor body.

7. The semiconductor device of claim 6, wherein at least one of the dielectric regions extends from the first surface to the second surface.

8. The semiconductor device of claim 6, wherein at least one of the dielectric regions encircles the first region.

9. The semiconductor device of claim 8, wherein the at least one dielectric region extends from the first surface to the second surface, and wherein the second termination region is electrically coupled to the source electrode through a coupling structure comprising:
a contact electrode on the second surface electrically coupled to the second termination region; and
a coupling region of the same doping type as the first termination region electrically coupled to the contact electrode in the region of the second surface and coupled to the source electrode in the region of the first surface.

10. The semiconductor device of claim 6, wherein the dielectric regions extend outwardly from the first region.

11. The semiconductor device of claim 1, wherein the source electrode is connected to the body region, and wherein the second termination region is electrically coupled to the source electrode through a coupling structure comprising:
a contact electrode on the second surface electrically coupled to the second termination region; and
a coupling region of the same doping type as the second termination region electrically coupled to the contact electrode in the region of the second surface and coupled to a body extension in the region of the first surface, the body extension extending between the body region and the coupling region along the first surface.

12. The semiconductor device of claim 1, wherein the edge termination structure further comprises a plurality of compensation regions of a doping type complementary to the doping type of the first edge termination region, extending in the vertical direction of the semiconductor body and located between the drift region and the second termination region in the lateral direction of the semiconductor body.

13. The semiconductor device of claim 12, wherein at least one of the compensation regions extends from the first surface to the second surface.

14. The semiconductor device of claim 12, wherein the compensation regions encircle the first region or are pile-shaped.

15. The semiconductor device of claim 1, wherein the first via encircles the first and second regions.

16. The semiconductor device of claim 1, wherein a dielectric layer extending from the first surface to the second surface encircles the first and second regions, and wherein the first via is arranged in the dielectric layer.

17. The semiconductor device of claim 16, wherein the first via includes at least two via sections that are distant in a lateral direction.

18. The semiconductor device of claim 17, wherein the at least two via sections are arranged in the dielectric layer.

19. The semiconductor device of claim 1, wherein the at least one device cell is implemented as a MOSFET cell.

20. The semiconductor device of claim 1, wherein the at least one device cell is implemented as a JFET cell.

\* \* \* \* \*

UNITED STATES PATENT AND TRADEMARK OFFICE
CERTIFICATE OF CORRECTION

| | | |
|---|---|---|
| PATENT NO. | : 8,546,875 B1 | Page 1 of 1 |
| APPLICATION NO. | : 13/420076 | |
| DATED | : October 1, 2013 | |
| INVENTOR(S) | : F. Hirler et al. | |

It is certified that error appears in the above-identified patent and that said Letters Patent is hereby corrected as shown below:

On Title Page, item (65) Prior Publication Data, please insert --US 2013/0240955 A1 Sep. 19, 2013--

Signed and Sealed this
Eighteenth Day of February, 2014

Michelle K. Lee
*Deputy Director of the United States Patent and Trademark Office*